(12) United States Patent
Kokubun

(10) Patent No.: US 9,204,068 B2
(45) Date of Patent: Dec. 1, 2015

(54) SOLID-STATE PHOTODIODE IMAGING DEVICE AND METHOD OF MANUFACTURING THE SAME

(71) Applicant: Koichi Kokubun, Kanagawa (JP)

(72) Inventor: Koichi Kokubun, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 317 days.

(21) Appl. No.: 13/684,986

(22) Filed: Nov. 26, 2012

(65) Prior Publication Data

US 2014/0055655 A1    Feb. 27, 2014

(30) Foreign Application Priority Data

Aug. 22, 2012 (JP) ................. 2012-183449

(51) Int. Cl.
  *H04N 5/374* (2011.01)
  *H01L 31/0232* (2014.01)
  *H01L 27/146* (2006.01)

(52) U.S. Cl.
  CPC .......... *H04N 5/374* (2013.01); *H01L 27/14621* (2013.01); *H01L 27/14627* (2013.01); *H01L 27/14629* (2013.01); *H01L 27/14685* (2013.01); *H01L 31/02327* (2013.01)

(58) Field of Classification Search
  CPC ..................................................... H04N 3/155
  USPC ..................................... 348/308; 257/432, 72
  See application file for complete search history.

(56) References Cited

U.S. PATENT DOCUMENTS

| | | | |
|---|---|---|---|
| 7,031,566 B2 * | 4/2006 | Kochergin et al. ............... | 385/27 |
| 7,085,467 B2 | 8/2006 | Ikemoto et al. | |
| 7,683,311 B2 * | 3/2010 | Mouli ........................... | 250/226 |
| 2005/0128592 A1 * | 6/2005 | Nishii et al. .................. | 359/573 |

(Continued)

FOREIGN PATENT DOCUMENTS

| | | |
|---|---|---|
| JP | 2001-249235 | 9/2001 |
| JP | 2005-292787 | 10/2005 |

(Continued)

OTHER PUBLICATIONS

Taya Keiji, Solid-State Imaging Device, JP Patent Application Publication 2008-053627, Mar. 2008, Machine Translation, IPDL.*

(Continued)

*Primary Examiner* — Roberto Velez
*Assistant Examiner* — Cynthia Segura
(74) *Attorney, Agent, or Firm* — Oblon, McClelland, Maier & Neustadt, L.L.P.

(57) ABSTRACT

According to one embodiment, a solid-state imaging device includes: a photodiode which is provided in a pixel region in which each pixel in a pixel forming region above a substrate is disposed; an interconnection layer which includes interconnections to connect the photodiode to peripheral circuits and an interlayer insulating film to insulate the interconnections from each other, and is provided above the photodiode; a color filter which is provided above the interconnection layer corresponding to the pixel region, and limits a wavelength of light incident on the photodiode. A light incident position correcting layer is provided between the color filter corresponding to the pixel disposed in at least the outer peripheral portion of the pixel forming region and the interconnection layer, and includes an anti-reflection film which is provided above the interconnection layer, and materials which have a negative refraction index and provided above the anti-reflection film.

15 Claims, 11 Drawing Sheets

(56) References Cited

U.S. PATENT DOCUMENTS

| | | |
|---|---|---|
| 2006/0006485 A1 | 1/2006 | Mouli |
| 2006/0214250 A1* | 9/2006 | Mouli .......................... 257/432 |
| 2007/0053651 A1* | 3/2007 | Akiyama et al. ............. 385/147 |
| 2007/0170349 A1* | 7/2007 | Mouli ........................ 250/208.1 |
| 2011/0134956 A1* | 6/2011 | Nagatomo et al. ......... 372/50.11 |
| 2012/0155502 A1* | 6/2012 | Matsuo et al. ............. 372/45.01 |

FOREIGN PATENT DOCUMENTS

| | | | |
|---|---|---|---|
| JP | 2006-73882 | 3/2006 | |
| JP | 2008-53627 | 3/2008 | |
| JP | 2008053627 A * | 3/2008 | ............. H01L 27/14 |
| JP | 2010-243682 | 10/2010 | |
| WO | WO 2011027555 A1 * | 3/2011 | ................ H01S 5/20 |

OTHER PUBLICATIONS

Takashi Matsumoto, et al., "FDTD Analysis of Wavelength Demultiplexer Composed of Photonic Crystal Superprism and Superlens", http://ci.nii.ac.jp/naid/10016575199, Jun. 17, 2005, 2 pages.

Japanese Office Action issued Jan. 6, 2015, in Japan Patent Application No. 2012-183449 (with English translation).

* cited by examiner

SOLID-STATE PHOTODIODE IMAGING DEVICE AND METHOD OF MANUFACTURING THE SAME

CROSS-REFERENCE TO RELATED APPLICATIONS

This application is based upon and claims the benefit of priority from Japanese Patent Application No. 2012-183449, filed on Aug. 22, 2012; the entire contents of which are incorporated herein by reference.

FIELD

Embodiments disclosed herein relate generally to a solid-state imaging element, a solid-state imaging device and a method of manufacturing the same.

BACKGROUND

A defect-introduced solid-state imaging device is proposed in the related art, which is provided with a multi-layered interconnection layer and a microlens above a semiconductor substrate on which a light-receiving element is formed for every pixel region. In the solid-state imaging device, photonic crystals are disposed to guide light to the light-receiving element between the multi-layered interconnection layer and the microlens to improve a light condensing efficiency of the light-receiving element.

In addition, pixels of the existing CMOS (Complementary Metal-Oxide-Semiconductor) image sensors are being further shrunk, and with this an F value decreases in order to make resolution high. Therefore, a distance between a sensor chip IC (Integrated Circuit) and a camera lens tends to be shorter and shorter. As a result, light condensing loss such as shading occurs on the peripheral portion of sensor pixels due to light incident thereon with an inclination, so that the sensitivity of the image quality and the like are degraded. For example, in case of a pixel disposed near the outer peripheral portion among the pixels two-dimensionally disposed above the semiconductor substrate, the incident light with an inclination passed through the microlens does not reach the light-receiving element of the corresponding pixel but is guided along an optical path to be mixed in an adjacent pixel. Therefore, a light-harvesting property is declined.

DETAILED DESCRIPTION

In general, according to one embodiment, there is provided a solid-state imaging device including a photodiode, an interconnection layer which is provided above the photodiode, a filter, a light incident position correcting layer. The photodiode is provided in a pixel region in which each of a plurality of pixels is disposed, and the pixels are formed in a pixel forming region above a substrate in a matrix shape. The interconnection layer includes interconnections to connect the photodiode to peripheral circuits formed above the substrate and an interlayer insulating film to insulate the interconnections from each other. The filter is provided above the interconnection layer corresponding to each pixel region to limit a wavelength of the light incident on the photodiode. The light incident position correcting layer is provided between the filter corresponding to the pixel disposed in at least the outer peripheral portion of the pixel forming region and the interconnection layer. Further, the light incident position correcting layer includes an anti-reflection film which is provided above the interconnection layer and materials which have a negative refraction index and provided above the anti-reflection film.

A solid-state imaging element, a solid-state imaging device, and a method of manufacturing the same according to embodiments will be described in detail with reference to the accompanying drawings herein below. Further, the invention is not limited to the embodiments. In addition, the cross-sectional views of the solid-state imaging device used in the following embodiments are schematically illustrated, so that relations between thicknesses and widths of layers, and thickness ratios and the like of the respective layers may be different from the actual ones. Furthermore, the film thicknesses to be described below are provided as examples, and the invention is not limited thereto.

First Embodiment

Figure 1:
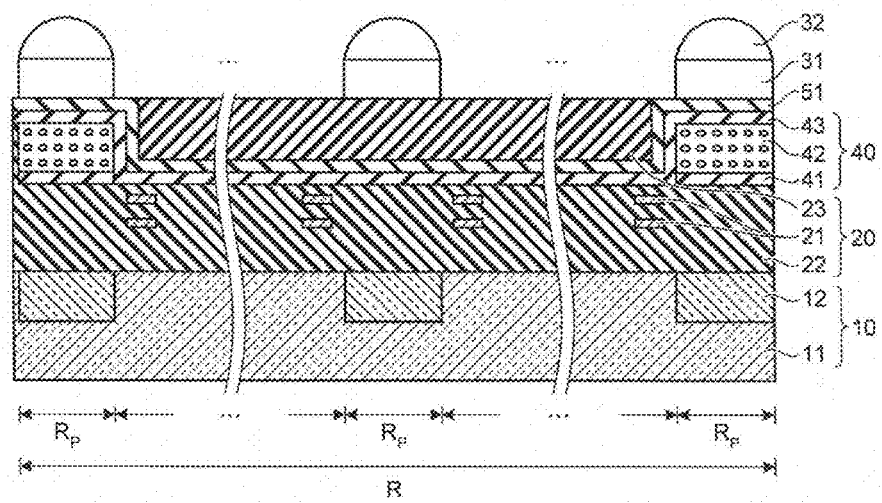
FIG. 1 is a cross-sectional view schematically illustrating a configuration of a solid-state imaging device according to a first embodiment.

FIG. 1 is a cross-sectional view schematically illustrating a configuration of a solid-state imaging device according to a first embodiment. The solid-state imaging device, for example, is a CMOS sensor. The solid-state imaging device is provided with: a pixel forming portion 10 in which pixels are formed, the pixel including a photoelectric conversion element and an element reading a signal from the photoelectric conversion element; an interconnection layer 20 in which interconnections are formed to be connected to the element formed in the pixel forming portion 10; a protection film 51 which protects the upper portion of the interconnection layer 20; a color filter 31 which limits a wavelength of light incident on each pixel of the pixel forming portion 10; and a microlens 32 which is provided for each pixel.

The pixel forming portion 10 is configured of a substrate 11 such as a predetermined conductive type of single-crystal silicon substrate in which the pixels are formed in a matrix shape. In each of pixel regions $R_p$ of the substrate 11 which are partitioned by pixel separating portions (not illustrated), a photodiode 12 is provided as the photoelectric conversion element which detects incident light passing through the microlens 32 and the color filter 31. Each photodiode 12 corresponds to a pixel. The light beams received by the respective photodiodes 12 are different in wavelength from each other due to the operation of the color filter 31. In addition to the above components, the pixel region $R_p$ is provided with a read transistor (not illustrated) which reads an electrical level of charges accumulated in the photodiode 12 and the like.

Further, in a peripheral circuit region (not illustrated) above the substrate 11, transistors which constitute a signal processing circuit which processes electrical signals (pixel signals) converted and output by the photodiode 12, a driving control circuit for controlling the output of the pixel signals through the driving of the photodiode 12, and the like are formed.

The interconnection layer 20 includes interconnections 21 and interlayer insulating films 22 and 23. The interconnections 21 are provided to electrically connect the photodiode 12 and the peripheral circuits, which may be formed by one or plural layers. In addition, the connections between the interconnections 21 or between the interconnections 21 and the elements formed in the substrate 11 are made through via holes or contact holes which are not illustrated. Examples of the materials of the interconnection 21 may include metal such as aluminum, copper, titanium, molybdenum, and tungsten or silicide such as TiSi, MoSi, and WSi. In this way, the interconnections 21 serve as light shields made of a metallic material and thus are provided at positions where the light incident on a light-receiving region of the photodiode 12 is not blocked.

The interlayer insulating films 22 and 23 are provided for electrical insulation for the interconnections 21 and the interconnections 21, between the substrate 11 and the lowermost interconnection 21, and between the uppermost interconnection 21 and the color filter 31. For example, silicon oxide may be used as the interlayer insulating films 22 and 23.

The protection film 51 is a film which is provided in a lower layer of the color filter 31 in terms of the manufacturing process such that the top face of the interlayer insulating film 23 becomes flush with the protection film 51 at positions where a light incident position correcting layer 40 to be described below is formed. For example, a silicon oxide film or a silicon nitride film may be used as the protection film 51.

The color filter 31 is provided above the photodiode 12 to transmit light in a specific wavelength band toward the photodiode 12. In general, for example, three pixels constitute a picture element, and the color filters 31 of red (R), green (G), and blue (B) each are provided for the pixels in the picture element. Note that, this configuration is presented as an example, and the color filters 31 of other colors may be used in which the number of the color filters 31 in one picture element has no limitation. In addition, while not illustrated in the drawing, the picture elements are two-dimensionally disposed above the substrate 11 in a predetermined cycle.

The microlens 32 is provided on the color filter 31 in each pixel region $R_p$ to condense the light into the pixel region $R_p$.

The solid-state imaging device according to the embodiment is configured to dispose the light incident position correcting layer 40, which serves to make the position of the emitted light move to the incident direction, between the color filter 31 and the interconnection layer 20 (the interlayer insulating film 22) in at least the pixel disposed at the outer peripheral of a pixel forming region R in which the pixels are two-dimensionally formed. The light incident position correcting layer 40 is configured such that an anti-reflection film 41, photonic crystals 42 having a negative refraction index, and an anti-reflection film 43 are stacked on the interlayer insulating film 22.

The anti-reflection film 41 is provided between the photonic crystals 42 and the interlayer insulating film 22 to prevent the reflection of the incident light. In addition, the anti-reflection film 43 is provided between the color filter 31 and the photonic crystals 42 to prevent the reflection of the incident light. However, the anti-reflection film 43 may be provided as needed. Note that, in the specification, the photodiode 12, the interconnection layer 20, the color filter 31, and the microlens 32, which are provided for each pixel in the solid-state imaging device, are called a solid-state imaging element.

Figure 2A:
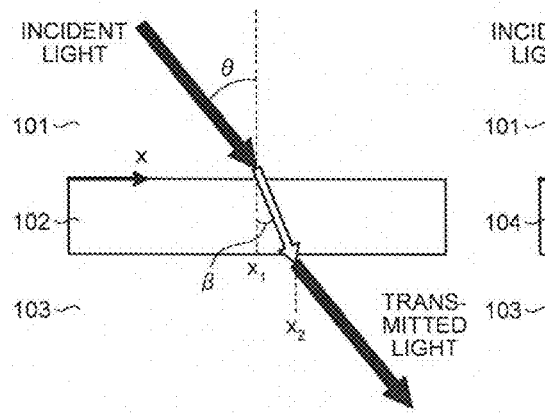
FIGS. 2A and 2B are diagrams schematically illustrating refraction patterns of light in a material.
Figure 2B:
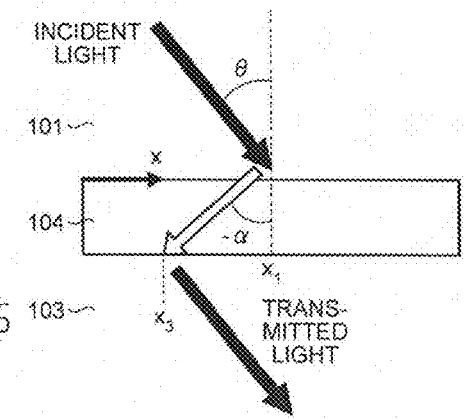

Herein, the photonic crystals 42 will be described. FIGS. 2A and 2B are diagrams schematically illustrating refraction patterns of light in a material, in which FIG. 2A illustrates a refraction pattern of light in a material having a positive refraction index and FIG. 2B illustrates a refraction pattern of light in a material having a negative refraction index. In the drawings, a direction obtained by projecting a traveling direction of the incident light to the boundary between materials is defined as an x direction.

As illustrated in FIG. 2A, an optical refraction index of a typical material 102 is a positive parameter, and in this case the light generally shows a phenomenon in which the light is refracted at the boundary between the materials but travels on an inclined path. That is, when the light is incident on the material 102, for example, at an incident angle θ from the air 101, the light is refracted in the material 102 at a refracting angle β and then transmitted from the material 102 into the air 103. As a result, assuming that an incident position of the light on the material 102 is $x_1$, the emitting position $x_2$ from the material 102 moves on a positive side from the incident position $x_1$ in the x direction. In general, the refraction index will be positive as long as a naturally-occurring material is concerned.

On the other hand, in recent years, a phenomenon has been known in which the material shows a behavior like having the negative refraction index when materials having another refraction index, for example, materials called the photonic crystals, are artificially arranged in a cycle shorter than the wavelength ("FDTD Analysis of Wavelength Demultiplexer Composed of Photonic Crystal Superprism and Superlens," TAKASHI MATSUMOTO, SHINJI FUJITA, and TOSHIHIKO BABA, IEIC Technical Report (Institute of Electronics, Information and Communication Engineers), OPE, Optical Electronics Vol. 105 (No. 142), pp. 47-50, Jun. 17, 2005). When the photonic crystals 104 having such a negative refraction index are used, the optical path of the light is bent in a reverse direction with respect to the incident direction of the light in the photonic crystals 104, as illustrated in FIG. 2B. That is, for example, when the light is incident on the photonic crystals 104 at the incident angle θ from the air 101, the light is refracted at the refracting angle −α in the photonic crystals 104. Furthermore, even when the light is transmitted from the photonic crystals 104 into, for example, the air 103, the traveling direction is refracted. In this way, the light incident on the photonic crystals 104 is refracted in the reverse direction, but turns back to the original direction when it is emitted from the photonic crystals 104. As a result, assuming that the incident position of the light in the photonic crystals 104 is $x_1$, the emitting position $x_3$ from the photonic crystals 104 moves back on the negative side (the incident side) from the incident position $x_1$ in the x direction.

Figure 3:
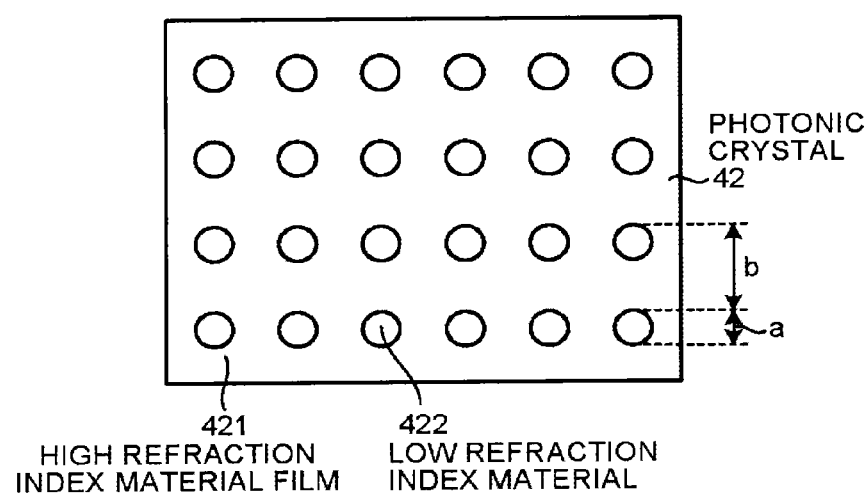
FIG. 3 is a top view schematically illustrating an exemplary structure of photonic crystals used in the first embodiment.

FIG. 3 is a top view schematically illustrating an exemplary structure of the photonic crystals used in the first embodiment. The photonic crystals 42 having the above-mentioned negative refraction index are configured such that low refraction index materials 422 having a refraction index higher than that of the air (refraction index: 1) are three-dimensionally and periodically disposed in a high refraction index material film 421 which has a refraction index higher than that of the low refraction index material 422. Specifically, the low refraction index materials 422 having a shape such as a prismatic shape, a spherical shape, a cylindrical shape, or a bowl shape are three-dimensionally and periodically disposed at vertexes of a cubic lattice or a regular tetrahedron. When the diameter (size) a of the low refraction index material 422 in the photonic crystals 42 is 60 to 90 nm, and the pitch b of the low refraction index material 422 is 100 to 200 nm, the negative refraction index can be achieved with respect to the light in a visible light range. In addition, with such a displacement, the photonic crystals are configured to have the same displacement when viewed from any direction in a three-dimensional space. For example, polysilicon (Si) may be used as the high refraction index material film 421, and silicon oxide film ($SiO_2$) or the air may be used as the low refraction index material 422.

The size of the photonic crystals 42 arranged in the pixel (the number of cycles of the low refraction index materials 422) is represented by the number of arrangements depending on the pixel size in a direction parallel to the substrate face, and one row (one cycle) or more are arranged in the height direction. With such a structure, the effect illustrated in FIG. 2B can be achieved. However, it is preferable that the number of cycles of the low refraction index materials 422 in the height direction can be adjusted according to a distance for correcting the positions. In a case where the number of cycles of the low refraction index materials 422 in the height direction is set to be 3 rows (3 cycles) or more, the position of the light emitted from the photonic crystals 42 can turn back so as to be incident on the photodiode 12 of the corresponding pixel.

Figure 4A:
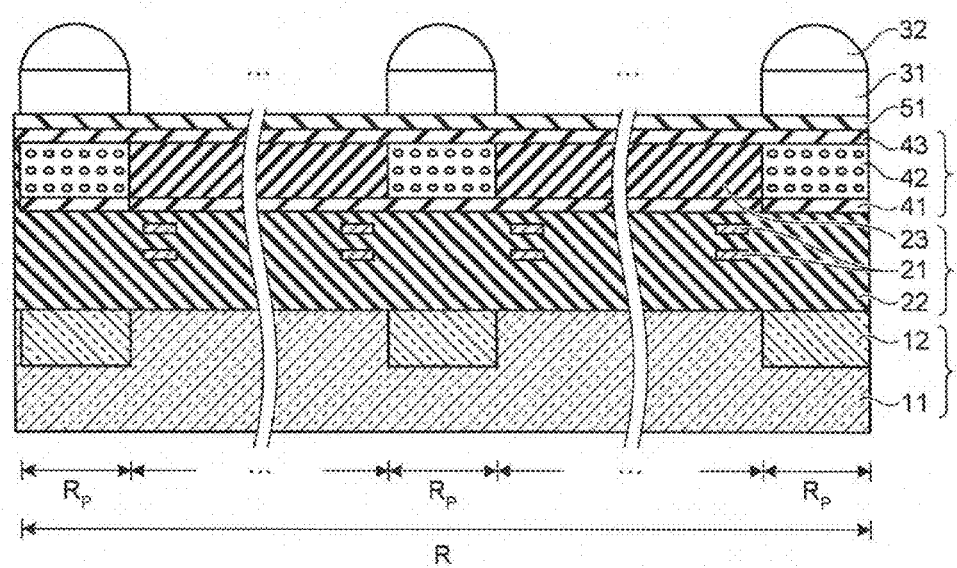
FIGS. 4A and 4B are diagrams illustrating an example of a region in which the photonic crystals are arranged.
Figure 4B:
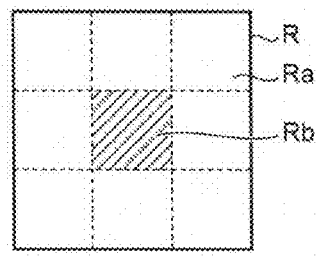

In addition, the number of the photonic crystals 42 to be disposed on the outer peripheral side of the pixel forming region R varies depending on a diameter or a focal length of an actual camera lens. In a practical specification, the number of the photonic crystals may be adjusted depending on the pixel position in the outer peripheral in which the angle increases. In this case, it is ideal for the installation region of the photonic crystals 42 to be changed based on the diameter, the focal length, or the like of a camera lens to be used. However, after making the light incident with an inclination by combining the diameters or the focal lengths of actually used camera lenses, a range of pixels in which the light may be mixed into adjacent pixels is calculated, and then the installation region of the photonic crystals 42 may be changed based on a wide range of the pixels on which the light is incident with an inclination. FIGS. 4A and 4B are diagrams illustrating an example of a region in which the photonic crystals are disposed. As illustrated in FIG. 4A, the photonic crystals 42 (the light incident position correcting layer 40) may be provided in the entire pixel forming region R and as illustrated in FIG. 4B, the pixel forming region R is divided into 9 regions and the photonic crystals 42 may be provided in regions Ra among the divided regions except the center region Rb.

Figure 5:
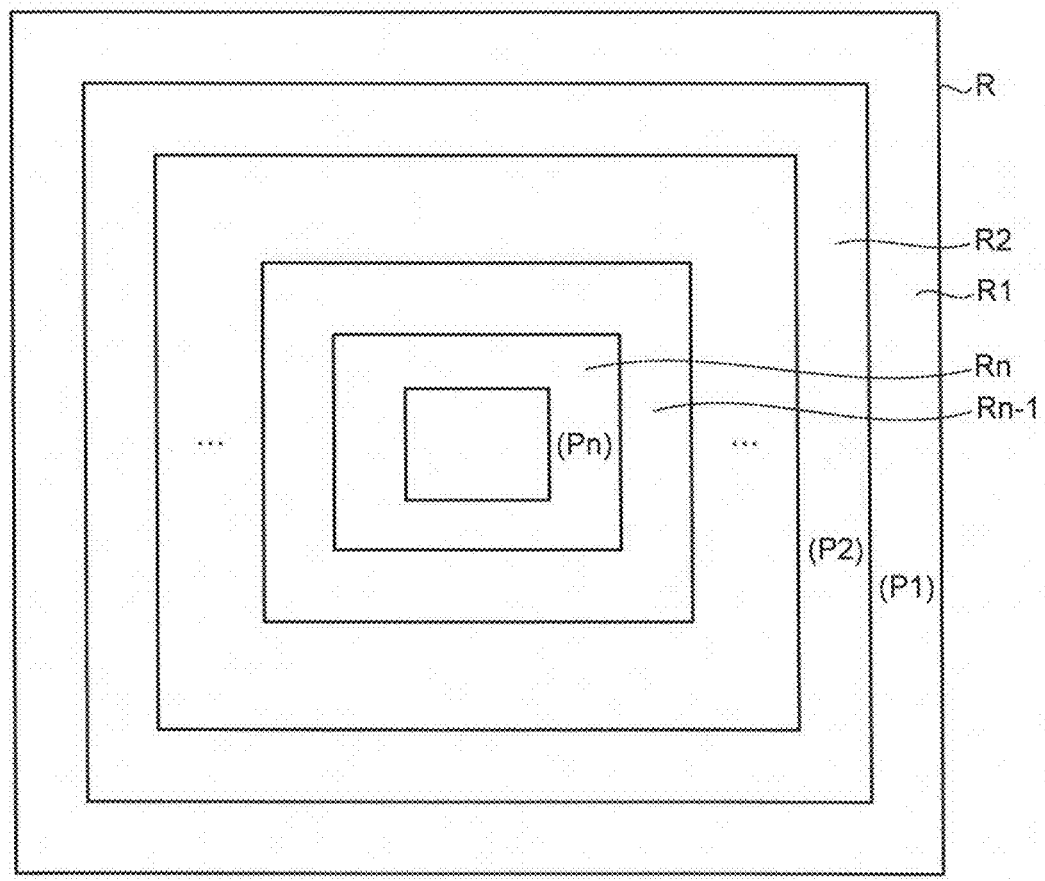
FIG. 5 is a diagram illustrating an example of a method of disposing the photonic crystals in a pixel forming region.

Furthermore, the cyclic structures of the photonic crystals 42 may be constant in one pixel forming region R, or may be different from each other in every region. FIG. 5 is a diagram illustrating an example of a method of disposing the photonic crystals in the pixel forming region. As illustrated in the drawing, the pixel forming region R is divided into a plurality of ring-shaped regions R1 to Rn (n represents a natural number) from the outer peripheral side, and the respective regions are changed in pitch (or the diameter of the low refraction index material 422) of the photonic crystals 42 in the cyclic structure. Generally, the incident angle of the incident light increases as the region comes to near the outer peripheral portion of the pixel forming region R. For example, the region R1 of the outer peripheral portion is configured to make the pitch of the low refraction index materials 422 of the photonic crystals 42 have P1; the region R2 adjacent to the inside of the region R1 is configured to make the pitch of the low refraction index materials 422 of the photonic crystals 42 have P2; and so on, and the region Rn adjacent to the inside of the region Rn−1 is configured to make the pitch of the low refraction index materials 422 of the photonic crystals 42 have Pn. Then, with the configuration in which a difference between the incident position of the light to the photonic crystals 42 and the emitting position of the light from the photonic crystals 42 is made to be large as the region comes to near the region R1 of the outer peripheral portion from the region Rn, it is possible to correct the position of the incident light according to the incident angle of the incident light.

Further, the photonic crystals 42 used in the embodiment is configured such that the low refraction index materials 422 formed in a predetermined size are three-dimensionally and periodically disposed in the high refraction index material film 421, but no line defect or point defect is introduced in the cyclic structure. Namely, it is not the case where the photonic crystals which constitute wave guides are used by the introduction of a line-shape defect or the like to the three-dimensionally cyclic structure, but the case where the photonic crystals 42 are used which include the negative refraction index only in the three-dimensionally cyclic structure without defective structure.

Figure 6A:
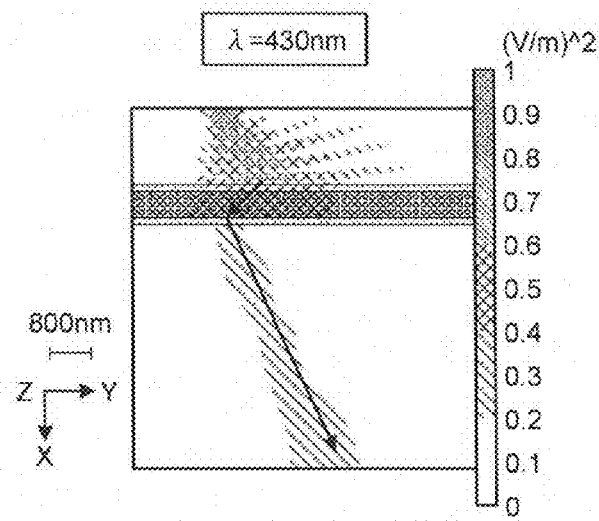
FIGS. 6A to 6C are diagrams illustrating calculation results of optical simulations in which an optical path of the photonic crystals having a negative refraction index is simulated.
Figure 6B:
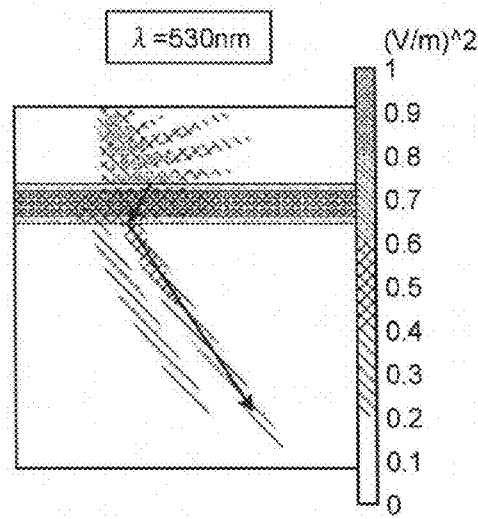
Figure 6C:
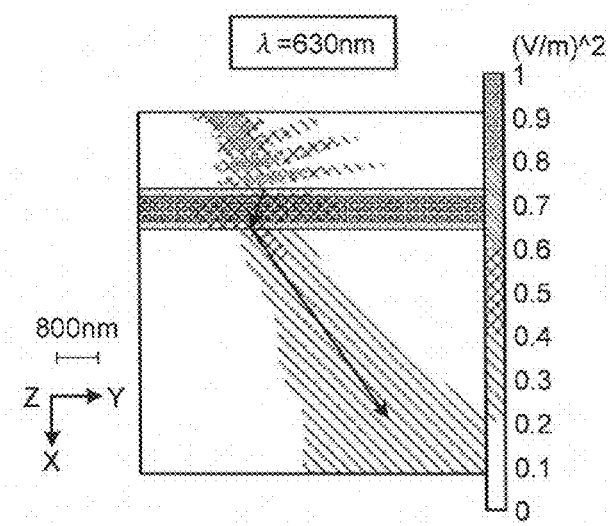

FIGS. 6A to 6C are diagrams illustrating calculation results of optical simulations in which an optical path of the photonic crystals having a negative refraction index is simulated. For example, in a case where the photonic crystals 42 are formed in the high refraction index material film 421 having the refraction index 3 such that the low refraction index materials 422, which have a diameter of 75 nm and a refraction index of 1.45, are stacked by three cycles in a cubic lattice shape at a pitch of 150 nm, FIG. 6A is a diagram illustrating an optical path in a case of incidence of the light having a wavelength of 430 nm on the photonic crystals 42; FIG. 6B is a diagram illustrating the optical path in a case of incidence of the light having a wavelength of 530 nm; and FIG. 6C is a diagram illustrating the optical path in a case of incidence of the light having a wavelength of 630 nm. As illustrated in the drawing, the photonic crystals 42 make the optical path of even any light beam, corresponding to a color B, G, or R, refracted to the same direction, and thus it is possible to make the emitting position from the photonic crystals 42 turning back to the incident direction of the light. Provided that, in the case of this photonic crystals 42, the effect is boosted as the wavelength becomes shorter.

Figure 7A:
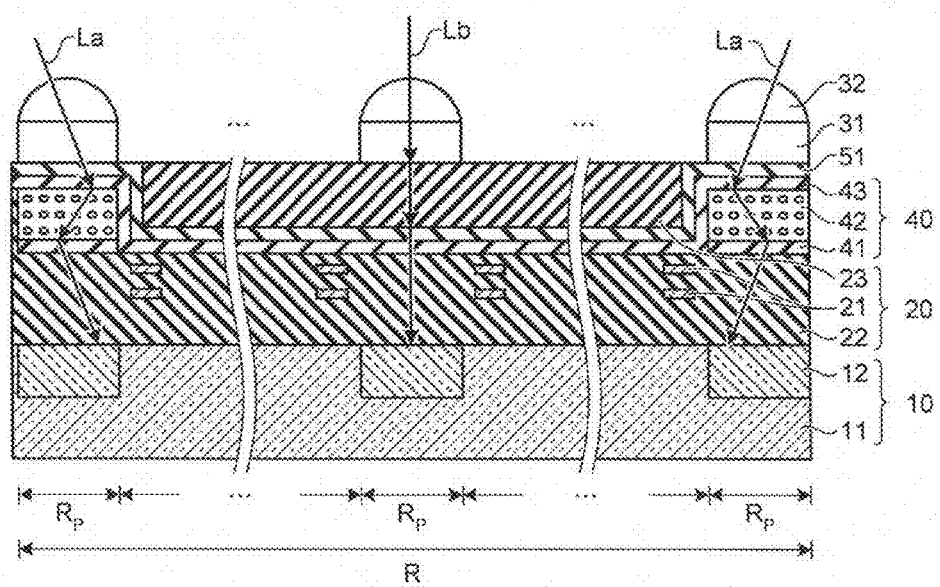
FIGS. 7A to 7C are diagrams schematically illustrating an operation of the solid-state imaging device according to the embodiment.
Figure 7B:
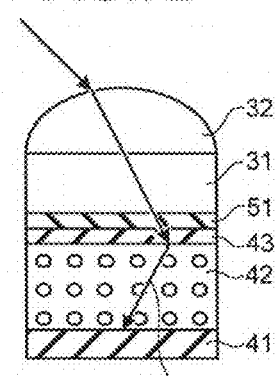
Figure 7C:
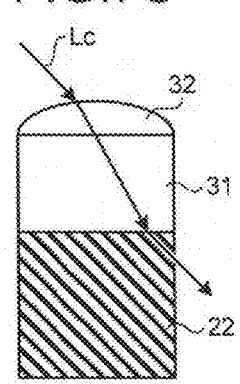

FIGS. 7A to 7C are diagrams schematically illustrating an operation of the solid-state imaging device according to the embodiment, in which FIG. 7A is a cross-sectional view illustrating the entire solid-state imaging device, FIG. 7B is a cross-sectional view illustrating a pixel on an outer peripheral portion near the photonic crystals, and FIG. 7C is a cross-sectional view illustrating a conventional case in which a pixel on the outer peripheral portion has no photonic crystals. As illustrated in FIG. 7A, the light is incident on the pixel near the center of the pixel forming region R of the solid-state imaging device in a direction perpendicular to the substrate as depicted by an optical path Lb. However, the light is incident on the pixel near the outer peripheral portion of the pixel forming region R in an inclined direction with respect to the direction perpendicular to the substrate as depicted by an optical path La.

FIG. 7C illustrates the optical path in the pixel of the outer peripheral portion in a case where there is no photonic crystals 42. As depicted by an optical path Lc in the drawing, since the microlens 32, the color filter 31, the interconnection layer 20 (the interlayer insulating film 22) each have positive refraction indexes, when the light is incident on the substrate face in an inclined direction, the light transmitted through the color filter 31 will slip out to the adjacent pixel before the light reaches a light-receiving unit (the photodiode 12).

On the other hand, as depicted by the optical path La in FIG. 7B, the photonic crystals 42 having the negative refraction index is disposed in the outer peripheral portion of the pixel forming region R. Therefore, the light incident with an inclination turns to a direction, opposite to the direction in which the light has been incident, at the boundary between the color filter 31 (the anti-reflection film 43) and the photonic crystals 42. Then, the light turns once more to the direction, in which the light has been incident, at the boundary between the photonic crystals 42 and the anti-reflection film 41. In this way, the position of the light emitted from the photonic crystals 42 is corrected so as to make the light turn back to the incident direction. As a result, while the occurrence of color mixing is suppressed from the pixel in the outer peripheral portion of the pixel forming region R, the light is easily introduced to the photodiode 12.

Figure 8A:
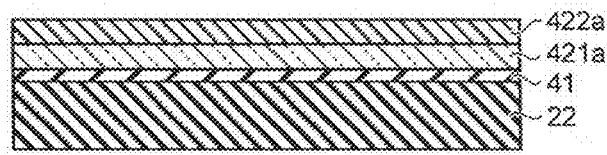
FIGS. 8A to 8F are cross-sectional views schematically illustrating an example of procedures performed in a method of manufacturing the solid-state imaging device according to the first embodiment.

Next, a method of manufacturing the solid-state imaging device having such a structure will be described. FIGS. 8A to 8F are cross-sectional views schematically illustrating an example of procedures performed in a method of manufacturing the solid-state imaging device according to the first embodiment. FIG. 9 is a top view of FIG. 8B. Further, since a method of manufacturing portions other than the photonic crystals 42 is the same as that in the conventional solid-state imaging device, the description herein will be made only for the method of manufacturing the photonic crystals 42.

First, similarly to the conventional solid-state imaging device, the photodiodes are two-dimensionally disposed above the substrate; peripheral circuits and the like are formed; and the interconnections are formed thereon through the interlayer insulating film 22. Then, as illustrated in FIG. 8A, the anti-reflection film 41, a high refraction index material film 421a, and a low refraction index material film 422a are sequentially stacked on the interlayer insulating film 22. For example, a $SiO_2$ film and the like may be used as the interlayer insulating film 22, a SiN film may be used as the anti-reflection film 41, a poly-Si film having a thickness of 75 nm may be used as the high refraction index material film 421a, and a $SiO_2$ film having a thickness of 75 nm may be used as the low refraction index material film 422a.

A resist (not illustrated) is coated on the low refraction index material film 422a, and cylindrical patterns having a diameter of 75 nm are disposed at a pitch of 150 nm through a lithography technique to be in a tetragonal lattice shape in the pixel region which includes pixels in the outer peripheral portion of the pixel forming region. At this time, the resist is not disposed in a region where the photonic crystals 42 are not formed. Note that, herein, the pattern shape is a cylindrical shape, but may be a rectangular shape or a spherical shape. In addition, the diameter of the pattern may be in a range from 50 to 100 nm, and the pitch of the pattern may be in a range from 100 to 200 nm. Furthermore, as for a displacement method, the patterns may be formed in a two-dimensionally cyclic structure, or may be disposed to be positioned on vertexes of triangle lattices.

Figure 8B:
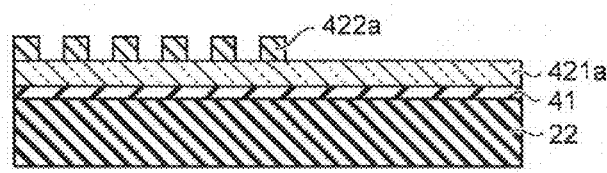
Figure 9:
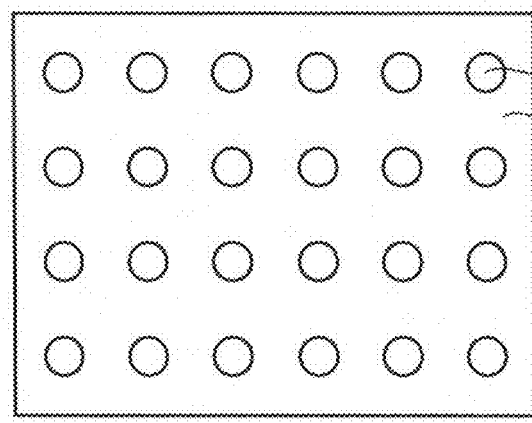
FIG. 9 is a top view of FIG. 8B.

Thereafter, as illustrated in FIGS. 8B and 9, the low refraction index material film 422a is etched using the patterned resist as a mask through an anisotropic etching technique such as an RIE (Reactive Ion Etching) method. Therefore, cylindrical pillars made of the low refraction index material film 422a are formed in the region having formed with the photonic crystals 42, and the low refraction index material film 422a is removed from the region having formed no photonic crystals 42.

Figure 8C:
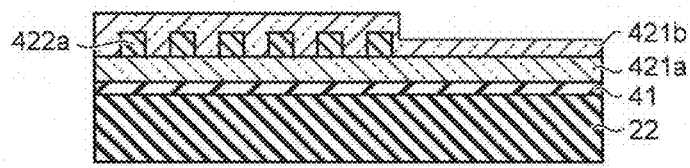
Figure 8D:
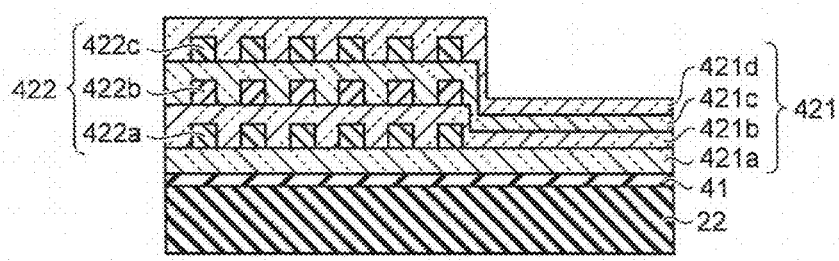

After the removal of the resist, as illustrated in FIG. 8C, a high refraction index material film 421b is formed with a predetermined thickness above the entire surface of the substrate 11. For example, the poly-Si film having a thickness of 75 nm may be used as the high refraction index material film 421b. Thereafter, by repeatedly performing the processes illustrated in FIGS. 8B and 8C by a predetermined number of times, as illustrated in FIG. 8D, the region having formed the photonic crystals 42 is formed such that the photonic crystals 42 are obtained in which the low refraction index material films 422a to 422c having the cylindrical shape in the high refraction index material films 421a to 421d are arranged three-dimensionally and periodically, and the region having formed no photonic crystals 42 is formed such that the high refraction index material films 421a to 421d are formed in a predetermined thickness.

Figure 8E:
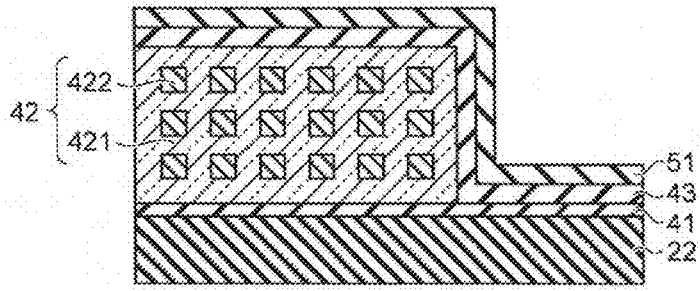

The resist (not illustrated) is coated above the entire surface of the substrate 11, and patterned such that only the region having formed the photonic crystals 42 is coated by the resist. The region having formed the photonic crystals 42 is a region including at least the outer peripheral portion of the pixel forming region as described above. Thereafter, the anisotropic etching technique such as the RIE method is employed to perform an etching process using the patterned resist as a mask, so that the high refraction index material films 421a to 421d in the region having formed with no photonic crystals 42 are removed. After the removal of the resist, as illustrated in FIG. 8E, the anti-reflection film 43 and the protection film 51 are formed above the entire surface of the substrate 11. The anti-reflection film 43 may be made of a material having a lower refraction index compared with the photonic crystals 42, for example, a SiN film or the like. In addition, the protection film 51 is formed to protect the photonic crystals 42 when the interlayer insulating film 23 filled in the region having formed no photonic crystals 42 is planarized.

Figure 8F:
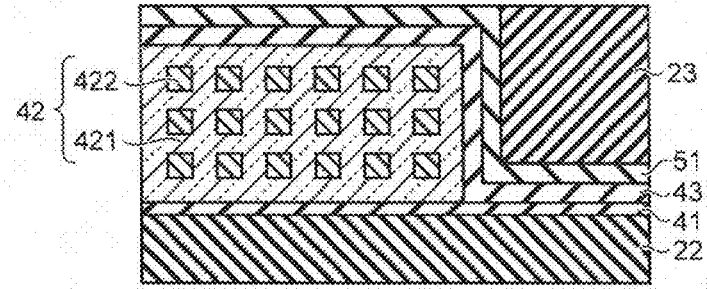

As illustrated in FIG. 8F, the interlayer insulating film 23 is formed above the entire surface of the substrate 11 such that the top face thereof is higher than that of the protection film 51 in the region having formed the photonic crystals 42. Then, while the interlayer insulating film 23 is removed until the protection film 51 is exposed from the region having formed the photonic crystals 42 through a CMP (Chemical Mechanical Polishing) method, the top face of the interlayer insulating film 23 is planarized. Thereafter, similarly to the conventional method of manufacturing the solid-state imaging device, the color filter 31 is disposed above each pixel region $R_p$, and further the microlens 32 is disposed on the color filter 31, thereby obtaining the solid-state imaging device illustrated in FIG. 1.

According to the first embodiment, since the photonic crystals 42 having the three-dimensionally cyclic structure is disposed in a layer under the color filter 31 of the pixel in the region including the outer peripheral portion of the pixel forming region R, the position of the light to be emitted from the photonic crystals 42 can turn to the incident direction of the light. As a result, even the light incident with an inclination is prevented from being incident on the adjacent pixel before reaching the photodiode 12, and the influence of cross talk on the pixel in the outer peripheral portion of the pixel forming region R can be reduced compared with the related art. In addition, even if the angle of a principal ray incident on the pixel in the outer peripheral portion of the pixel forming region R increases, it is possible to prevent the sensitivity of the image quality from being degraded due to the loss in light condensing.

Second Embodiment

FIGS. 10A to 10H are cross-sectional views illustrating an example of procedures performed in a method of manufacturing a solid-state imaging device according to a second embodiment. FIG. 11 is a top view of FIG. 10B. Since the method of manufacturing portions other than the photonic crystals 42 is the same as that in the conventional solid-state imaging device, the second embodiment will be described only for the method of manufacturing the photonic crystals 42.

Figure 10A:
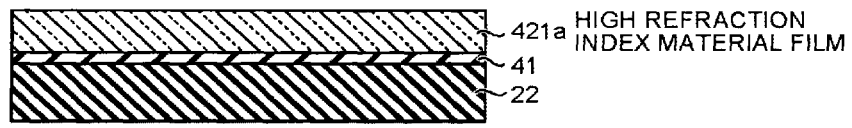
FIGS. 10A to 10H are cross-sectional views illustrating an example of procedures performed in a method of manufacturing a solid-state imaging device according to a second embodiment.
Figure 11:
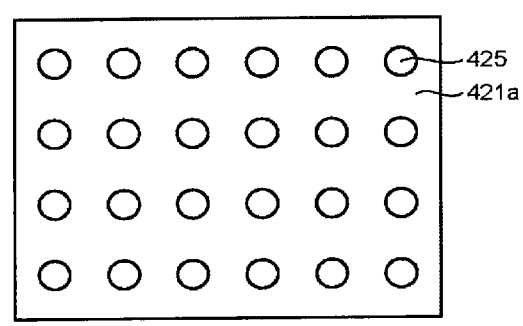
FIG. 11 is a top view of FIG. 10B.

First, as illustrated in FIG. 10A, the photodiodes are two-dimensionally disposed; the interlayer insulating film 22 is formed above the substrate in which peripheral circuits and the like are formed; and further the anti-reflection film 41 and the high refraction index material film 421a are sequentially stacked thereon. For example, a $SiO_2$ film and the like may be used as the interlayer insulating film 22, a SiN film may be used as the anti-reflection film 41, and a poly-Si film having a thickness of 150 nm may be used as the high refraction index material film 421a.

A resist (not illustrated) is coated on the high refraction index material film 421a, and cylindrical holes having a diameter of 75 nm are disposed at a pitch of 150 nm through a lithography technique so as to be in a tetragonal lattice shape in the resist region which includes pixels in the outer peripheral portion of the pixel forming region R. At that time, the resist is not disposed in a region where the photonic crystals 42 are not formed. Note that, herein, the pattern shape is a cylindrical shape, but may be a rectangular shape or a spherical shape. In addition, the diameter of the hole may be in a range from 50 to 100 nm, and the pitch of the pattern may be in a range from 100 to 200 nm. Furthermore, as for a method of disposing the holes, the holes may be formed in the two-dimensionally cyclic structure, or may be disposed to be positioned on vertexes of triangle lattices.

Figure 10B:
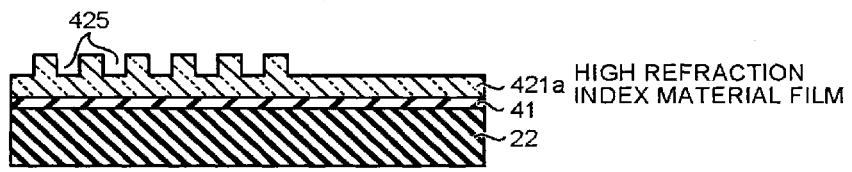

Thereafter, as illustrated in FIGS. 10B and 11, the high refraction index material film 421a is etched using the patterned resist as a mask through the anisotropic etching technique such as the RIE method to the depth in which the high refraction index material film 421a is not passed through. For example, the etching is performed to the half thickness (in this case, 75 nm) of the high refraction index material film 421a. Therefore, the region having formed the photonic crystals 42 is formed such that the cylindrical holes 425 are formed in the two-dimensionally cyclic structure in the high refraction index material film 421a, and the region having formed no photonic crystals 42 is formed such that the high refraction index material film 421a having a predetermined thickness is removed.

Figure 10C:
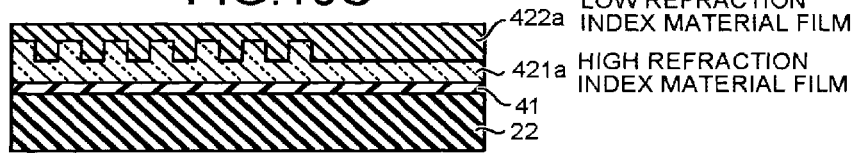
Figure 10D:
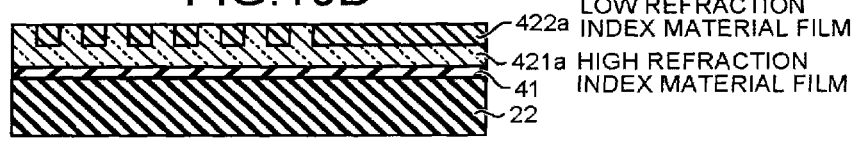

After the removal of the resist, as illustrated in FIG. 10C, the low refraction index material film 422a is formed above the entire surface of the patterned high refraction index material film 421a such that the low refraction index material film 422a fills the formed cylindrical holes 425 enough to be higher than the top face of the high refraction index material film 421a in the region having formed the photonic crystals 42. Thereafter, as illustrated in FIG. 10D, the low refraction index material film 422a which is formed to be higher than the high refraction index material film 421a is removed through the CMP method or the like. For example, the $SiO_2$ film may be used as the low refraction index material film 422a.

Figure 10E:
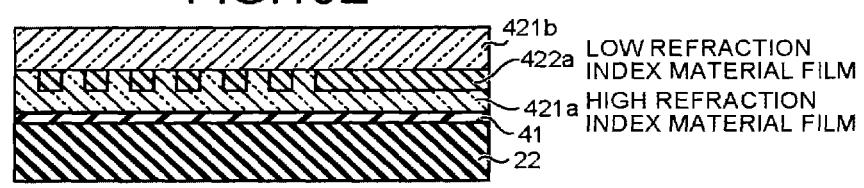
Figure 10F:
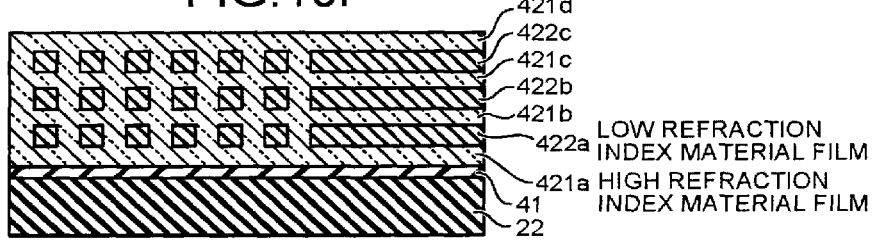

As illustrated in FIG. 10E, the high refraction index material film 421b is formed by a predetermined thickness above the entire surface of the substrate 11. For example, the poly-Si film having a thickness of 150 nm may be used as the high refraction index material film 421b. Thereafter, by repeatedly performing the processes illustrated in FIG. 10B to 10E by a predetermined number of times, as illustrated in FIG. 10F, the region having formed the photonic crystals 42 is formed such that the photonic crystals 42 are obtained in which the low refraction index material films 422a to 422c having the cylindrical shape are arranged three-dimensionally and periodically, and the region having formed no photonic crystals 42 is formed of a stacked film in which the high refraction index material films 421a to 421d and the low refraction index material films 422a to 422c are alternatively stacked.

Figure 10G:
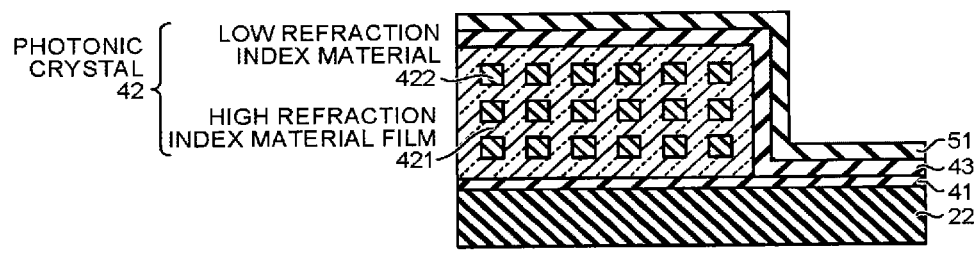

As illustrated in FIG. 10G, the resist (not illustrated) is coated above the entire surface of the substrate 11, and patterned such that only the region having formed the photonic crystals 42 is coated by the resist. Thereafter, the anisotropic etching technique such as the RIE method is employed to perform an etching process using the patterned resist as a mask, so that the stacked film including the high refraction index material films 421a to 421d and the low refraction index material films 422a to 422c in the region having formed no photonic crystals 42 is removed. After the removal of the resist, the anti-reflection film 43 and the protection film 51 are formed above the entire surface of the substrate. The anti-reflection film 43 may be made of a material having a lower refraction index compared with the photonic crystals 42, for example, a SiN film or the like. In addition, the protection film 51 is formed to protect the photonic crystals 42 when the interlayer insulating film 23 filled in the region having formed no photonic crystals 42 is planarized.

Figure 10H:
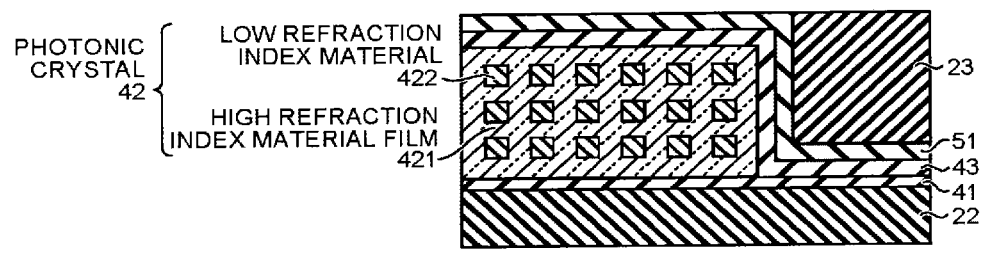

As illustrated in FIG. 10H, the interlayer insulating film 23 is formed above the entire surface of the substrate 11, and then while the interlayer insulating film 23 is removed until the protection film 51 is exposed from the region having formed the photonic crystals 42 through the CMP method, the top face of the interlayer insulating film 23 is planarized. Thereafter, similarly to the conventional method of manufacturing the solid-state imaging device, the color filter 31 is disposed on each pixel region $R_P$, and further the microlens 32 is disposed on the color filter 31, thereby obtaining the solid-state imaging device illustrated in FIG. 1.

Figure 12A:
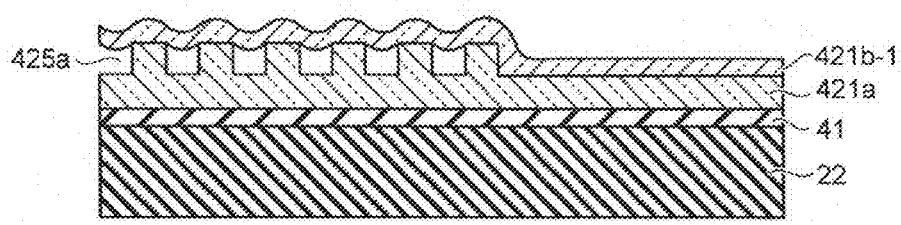
FIGS. 12A to 12C are cross-sectional views schematically illustrating an example of procedures performed in a method of manufacturing the solid-state imaging device in a case where a low refraction index material is the air.
Figure 12B:
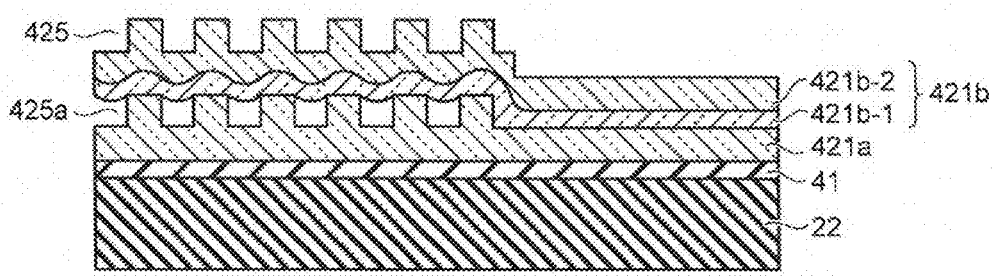
Figure 12C:
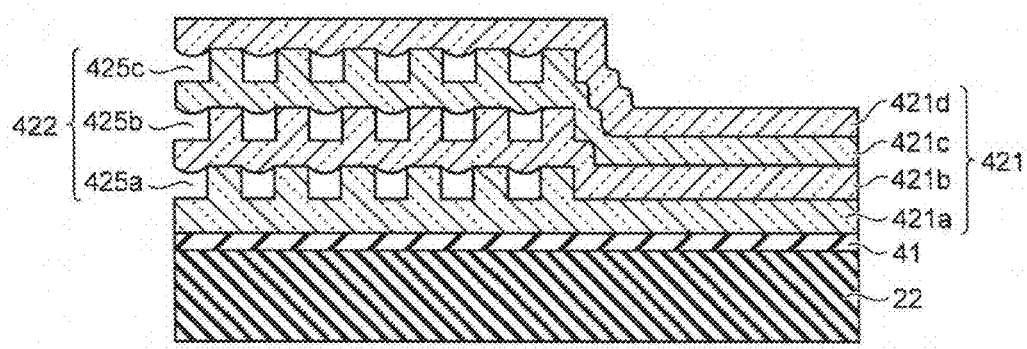

FIGS. 12A to 12C are cross-sectional views schematically illustrating an example of procedures performed in a method of manufacturing the solid-state imaging device in a case where the low refractive index material is the air. In a case where the low refraction index material of the photonic crystals 42 is the air, after the process illustrated in FIG. 10B, a high refraction index material film 421b-1 is formed on the high refraction index material film 421a having patterned with the holes 425 using a film formation method having poor filling characteristics as illustrated in FIG. 12A. The formed high refraction index material film 421b-1 is constructed such that valleys are formed at positions of the holes 425, and peaks in the region having formed the high refraction index material film 421b-1. In this way, the holes 425 are covered to form bowl-shaped spaces 425a. The spaces 425a, for example, contain the air (having a refraction index of 1).

As illustrated in FIG. 12B, a high refraction index material film 421b-2 is formed by a predetermined thickness on the high refraction index material film 421b-1. Then, the patterning is performed through the lithographic technique and the etching technique such that the cylindrical holes 425 having a predetermined size are two-dimensionally disposed in a predetermined cycle in the pixel region including the pixels in the outer peripheral portion of the pixel forming region R.

Thereafter, by repeatedly performing the processes illustrated in FIGS. 12A and 12B by a predetermined number of times, as illustrated in FIG. 12C, the region having formed the photonic crystals 42 is formed such that the photonic crystals 42 is obtained in which bowl-shaped spaces 425a to 425c are arranged three-dimensionally and periodically, and the region having formed no photonic crystals 42 is formed of a stacked film of the high refraction index material films 421a to 421d. Here, the low refraction index material 422 is configured of the spaces 425a to 425c. Then, the same processes illustrated in FIG. 10G and the subsequent drawings are performed, thereby manufacturing the solid-state imaging device.

According to the second embodiment, the solid-state imaging device having the structure illustrated in the first embodiment can also be manufactured. In addition, in the second embodiment, the holes 425 formed two-dimensionally and periodically in the high refraction index material film 421 are not filled with something else, and the upper portion is covered, so that the air can be contained in the spaces 425a to 425c. As a result, since the air having a refraction index of 1 can be used as the low refraction index material 422, the photonic crystals 42 having a great refraction index difference can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a photodiode which is in a pixel region in which each of a plurality of pixels is disposed, the pixels being formed in a pixel forming region above a substrate in a matrix shape;
an interconnection layer comprising interconnections to connect the photodiode to peripheral circuits formed above the substrate and an interlayer insulating film to insulate the interconnections from each other, wherein the interconnection layer is above the photodiode; and
a filter which is above the interconnection layer corresponding to the pixel region, wherein the filter limits a wavelength of light incident on the photodiode,
wherein a light incident position correcting layer is between the filter corresponding to the pixel disposed in at least the outer peripheral portion of the pixel forming region and the interconnection layer, the light incident position correcting layer comprising an anti-reflection film which is above the interconnection layer and materials which have a negative refraction index and is above the anti-reflection film, and the pixel without the light incident position correcting layer comprising the materials which have the negative refraction index is disposed in a center portion of the pixel forming region.

2. The solid-state imaging device according to claim 1, wherein the materials having the negative refraction index are photonic crystals which have a refraction index of 1 or higher, and in which low refraction index materials having a refraction index equal to or less than that of the interlayer insulating films are disposed in a three-dimensionally cyclic structure in a high refraction index material film having a refraction index higher than the interlayer insulating films and the low refraction index materials.

3. The solid-state imaging device according to claim 2, wherein the photonic crystals is configured such that the low refraction index materials are disposed in a cubic lattice shape or a tetrahedral lattice shape in the high refraction index material film.

4. The solid-state imaging device according to claim 3, wherein the low refraction index materials are 60 to 90 nm in size and disposed at a pitch of 100 to 200 nm.

5. The solid-state imaging device according to claim 4, wherein the size and the pitch of the low refraction index materials are constant in one pixel region in which the light incident position correcting layer is provided.

6. The solid-state imaging device according to claim 4, wherein the size or the pitch of the low refraction index materials is set to a different value according to a distance from the outer peripheral portion of the pixel forming region with the pixel region as a unit.

7. The solid-state imaging device according to claim 6, wherein the size or the pitch of the low refraction index materials is set such that an absolute value of a difference between an emitting position of light from the photonic crystals and an incident position of light to the photonic crystals increases as the pixel region comes to near the outer peripheral portion of the pixel forming region.

8. The solid-state imaging device according to claim 2, wherein
the interlayer insulating film is a material based on $SiO_2$,
the low refraction index material is a material based on $SiO_2$ or air, and
the high refraction index material film is a material based on Si.

9. A method of manufacturing a solid-state imaging device, the method comprising:
forming photodiodes above a substrate in a matrix shape;
forming an interconnection layer above the substrate, the interconnection layer comprising interconnections to connect the photodiode to peripheral circuits formed above the substrate and a first interlayer insulating film to insulate the interconnections;
forming sequentially a first anti-reflection film above the interconnection layer and a first high refraction index material film having a first refraction index;
forming a low refraction index material film on the first high refraction index material film, the low refraction index material film having a second refraction index which is lower than the first refraction index and a refraction index of the first interlayer insulating film and equal to or greater than 1;
etching the low refraction index material film in an island shape so that a two-dimensionally cyclic structure portion which has a two-dimensionally cyclic structure is formed in a region corresponding to the photodiode disposed in at least an outer peripheral portion of the pixel forming region in which the photodiodes are formed in a matrix shape, and the two-dimensionally cyclic structure portion is not formed in a region corresponding to the photodiode disposed in a center portion of the pixel forming region;

forming a second high refraction index material film having the first refraction index on the first high refraction index material film on which the two-dimensionally cyclic structure portion is formed, the second high refraction index material film becoming thicker than a thickness of the low refraction index material film;

removing the first and the second high refraction index material films in the center portion of the pixel forming region;

filling a second interlayer insulating film in the center portion of the pixel forming region; and forming a filter which limits a wavelength of light incident on the photodiode above the second interlayer insulating film corresponding to the region in which the photodiodes are formed respectively.

10. The method of manufacturing the solid-state imaging device according to claim 9, further comprising, after the removing of the first and the second high refraction index material films and before the filling of the second interlayer insulating film, forming a second anti-reflection film above the second high refraction index material film.

11. The method of manufacturing the solid-state imaging device according to claim 9, further comprising, after the removing of the first and the second high refraction index material films and before the filling of the second interlayer insulating film, forming a protection film above the second high refraction index material film, wherein in the filling of the second interlayer insulating film, the second interlayer insulating film is removed using the protection film as a stopper.

12. The method of manufacturing the solid-state imaging device according to claim 9, wherein the processes from the forming of the low refraction index material film to the forming of the second high refraction index material film are repeatedly performed by a predetermined number of times to form a three-dimensionally cyclic structure portion in which a plurality of the two-dimensionally cyclic structure portions are stacked in a height direction.

13. The method of manufacturing the solid-state imaging device according to claim 12, wherein in the forming of the two-dimensionally cyclic structure portion, the low refraction index materials are disposed such that the three-dimensionally cyclic structure portion is formed in a cubic lattice shape or a tetrahedral lattice shape.

14. The method of manufacturing the solid-state imaging device according to claim 9, wherein in the forming of the two-dimensionally cyclic structure portion, the two-dimensionally cyclic structure portion is formed such that the low refraction index materials with a size of 60 to 90 nm are disposed at a pitch of 100 to 200 nm.

15. The method of manufacturing the solid-state imaging device according to claim 14, wherein in the forming of the two-dimensionally cyclic structure portion, the size or the pitch of the low refraction index materials is set to a different value according to a distance from the outer peripheral portion of the pixel forming region with the pixel region as a unit.

* * * * *